(12) United States Patent
Suzuki et al.

(10) Patent No.: US 7,790,269 B2
(45) Date of Patent: Sep. 7, 2010

(54) ULTRA-THIN COPPER FOIL WITH CARRIER AND PRINTED WIRING BOARD USING ULTRA-THIN COPPER FOIL WITH CARRIER

(75) Inventors: Akitoshi Suzuki, Tochigi (JP); Shin Fukuda, Tochigi (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/205,439

(22) Filed: Sep. 5, 2008

(65) Prior Publication Data

US 2009/0011271 A1 Jan. 8, 2009

Related U.S. Application Data

(63) Continuation of application No. 10/984,896, filed on Nov. 10, 2004, now abandoned.

(30) Foreign Application Priority Data

Nov. 11, 2003 (JP) ............... 2003-381399
Mar. 12, 2004 (JP) ............... 2004-070806

(51) Int. Cl.
*B32B 3/10* (2006.01)
*B32B 15/20* (2006.01)
*C25D 1/04* (2006.01)
*C25D 7/06* (2006.01)
*H05K 1/09* (2006.01)

(52) U.S. Cl. ............ 428/209; 428/607; 428/674; 428/687; 428/626; 205/78; 205/223; 427/96.1

(58) Field of Classification Search ............ None
See application file for complete search history.

(56) References Cited

U.S. PATENT DOCUMENTS 5,114,543 A  5/1992  Kajiwara et al.
5,834,140 A  11/1998 Wolski et al.
5,863,410 A  1/1999  Yates et al.
6,270,889 B1 8/2001  Kataoka et al.
2003/0012975 A1 1/2003 Gales et al.
2003/0148136 A1 8/2003 Yamamoto et al.
2004/0029006 A1* 2/2004 Otsuka et al. ............ 429/220
2004/0038049 A1 2/2004 Suzuki et al.
2004/0121178 A1 6/2004 Suzuki et al.
2005/0048306 A1 3/2005 Suzuki et al.

FOREIGN PATENT DOCUMENTS

| EA | 2002-60981 | 2/2002 |
|---|---|---|
| EP | 1133220 A2 | 9/2001 |
| EP | 1133220 A3 | 9/2001 |
| EP | 1331088 A1 * | 7/2003 |
| JP | 2000-269637 A | 9/2000 |
| JP | 2000-331537 A | 11/2000 |
| JP | 2003/193290 A1 | 7/2003 |
| JP | 2003-524078 A | 8/2003 |
| JP | 2004-079523 * | 3/2004 |

* cited by examiner

*Primary Examiner*—John J Zimmerman
(74) *Attorney, Agent, or Firm*—Birch, Stewart, Kolasch & Birch, LLP

(57) ABSTRACT

To produce an ultra-thin copper foil with a carrier foil that microscopic crystal grains can be deposited without being affected by the surface roughness of a carrier foil, etching can be performed until an ultra-fine width such that line/space is 15 mum or less, and the microscopic line and a wiring board have large peel strength even after line of 15 mum is etched. An ultra-thin copper foil wherein a carrier foil, a peeling layer, an ultra-thin copper foil are laminated in this order, the ultra-thin copper foil (before roughening treatment is performed) is an electrolytic copper foil that surface roughness of 2.5 mum as ten point height of roughness profile, and the minimum distance between peaks of salients of a based material is 5 mum or more. Moreover, the surface of the ultra-thin copper foil is performed roughening treatment.

15 Claims, 3 Drawing Sheets

ULTRA-THIN COPPER FOIL WITH CARRIER AND PRINTED WIRING BOARD USING ULTRA-THIN COPPER FOIL WITH CARRIER

CROSS REFERENCE TO RELATED APPLICATION

This is a Continuation Application of U.S. application Ser. No. 10/984,896 (now abandoned) filed on Nov. 10, 2004 and claims priority under 35 U.S.C. §119 to Japanese Patent Application Nos. 2003-381399, filed on Nov. 11, 2003, and 2004-070806, filed Mar. 12, 2004, the entire contents of which are hereby incorporated by reference.

BACKGROUND OF THE INVENTION

1. Field of the Invention

The present invention relates to an ultra-thin copper foil with a carrier foil used at the time of producing a printed wiring board. In particular, the present invention relates to an ultra-thin copper foil with a carrier foil used preferably for producing a printed wiring board for high density ultra-fine wiring or a multilayer printed wiring board.

2. Description of the Related Art

A printed wiring board is produced as mentioned below.

First, after placing a thin copper foil for forming a surface circuit on a surface of an insulative substrate consisting of a glass epoxy resin or a polyimide resin and so on, by heating and laminating, a copper clad laminate is produced.

Next, after placing a through hole and a through hole plating are performed sequentially, an etching process is performed to a copper foil in the surface of the copper clad laminate, a wiring pattern having a desired line width and desired pitches of adjacent lines are formed, and finally, forming of a solder resist and other finishing processes are performed.

In the copper foil used at that time, a surface of the side that is laminated to a substrate is defined as a treatment side, an anchoring effect is exhibited on the substrates by the treatment side to improve the peel strength between the substrate and the copper foil to assure reliability as the printed wiring board.

Further, recently, the treatment side of the copper foil is covered with a resin for bonding such as an epoxy resin, and the copper foil with resin that this resin for bonding is made to an insulating resin layer in semi-cured state (B stage) is used as a copper foil for forming a surface circuit, then a printed wiring board, in particular a build up wiring board is produced by laminating side of the insulating resin layer to substrate.

Moreover, corresponding to high integration of various electronic parts, in such a build-up printed wiring board, density growth is needed for a wiring pattern, and there has been a demand for a printed wiring board with wiring patterns consisting a wiring of fine line widths and pitches of adjacent lines, that is to say, fine patterns. For example, in the case of a printed wiring board used for a semiconductor package, a printed wiring board having a high density ultra-fine wiring of which line widths and pitches of adjacent lines are around 15 mu m respectively has been demanded.

If a thick copper foil is used as a copper foil for a high density ultra-fine wiring board of such a printed wiring board, the time that is necessary for etching until reaching a surface of a substrate becomes longer. As a result, the verticality of the sidewalls of the wiring patterns formed is ruined, an etching factor indicated in the following equation Ef becomes smaller. $Ef=2H/(B-T)$ H is the thickness of a copper foil, is the bottom width of a formed printed wiring board.

T is the top width of a formed printed wiring board.

These problems are not serious in the case that the line width of wiring in the formed wiring pattern, however, it may lead to disconnection in the case of the wiring pattern of which line width is narrow.

On the contrary, in the case of a thin copper foil, the etching factor Ef can be larger.

Incidentally, peel strength of a conventional copper foil and a substrate assures peel strength by depositing copper grains on the surface of the side bonded with the substrate to be the treatment side and by embedding a protrusion of the copper grains of this copper foil to the substrate. Consequently, until the embedded protrusion of the copper grains is removed completely from the substrate, a copper remains (this phenomenon is usually called as treatment transfer after etching, it may be a cause that insulation failure is occurred in the case that the pitches of adjacent lines of the wiring pattern is narrow. The time for etching-removing this embedded protrusion of the copper grains completely does not greatly affect the wiring pattern, however the etching time affects greatly in the case that the thickness of the copper foil is thin. That is to say, since the etching time to remove the embedded protrusion becomes longer in comparison to the etching time of the copper foil, in the process of etching-removing the embedded protrusion, an etching of side wall of the wiring pattern already formed progresses, as a result, the Ef value becomes smaller.

In the case of using a thin copper foil, in fact, such a problem can be solved if the surface roughness is made smaller, however, in that case, it is difficult to produce the printed wiring board having the reliable and fine wiring pattern, since the peel strength between the copper foil and the substrate becomes smaller.

Moreover, in the case of the thin copper foil, since the mechanical strength is small, wrinkles and creases cause easily, further the copper foil may go out when producing a printed wiring board, therefore there is a problem that the greatest care is required for handling.

As mentioned above, it is considerably difficult to produce a printed wiring board having fine wiring pattern that the Ef value is large and that the peel strength is large as a practical matter. In particular, it is virtually impossible to form the wiring pattern with a high density ultra-fine wiring of which interval of lines or line width is around 15 mu m by using a commercially available copper foil, and in fact, it is strongly desired to develop a copper foil for permitting that.

As such a copper foil used for high density ultra-fine wiring (fine pattern) of which interval of lines or line width is around 15 mu m, a copper foil having the thickness is 9 mu m or leas, in particular 5 mu m or less is suitable.

As such an ultra-thin copper foil used for a fine pattern, the applicant of the present invention discloses the following techniques.

In Japanese Unexamined Patent Publication No. 2000-269637, a copper foil characterized that it is an ultra-thin copper foil with a carrier foil, a copper foil having a surface roughness Rz is 1.5 mu m or less is defined as a carrier foil, on the surface a peeling layer and an electrolytic copper plating layer are laminated in this order, and the surface of the outermost layer of the electrolytic copper plating layer is defined as a treatment side is disclosed.

In Japanese Unexamined Patent Publication No. 331537, a copper foil with a carrier foil is an ultra-thin copper foil wherein a copper foil is defined as a carrier foil, on the surface a peeling layer and an electrolytic copper plating layer are electroplated in this order, and a copper foil with a carrier foil characterized that a portion adjacent to right-and-left edges between the copper foil with a carrier foil and the electrolytic copper plating layer is made to be connected strongly in comparison to a middle portion of them and that the outermost surface of the electrolytic copper plating layer is roughened are disclosed.

In Published Japanese Translation of a PCT Application No. 2003-524078, a copper foil characterized that a carrier foil that is smoothed to make a mat surface roughness Rz is 3.5 mu m or lees is used, on the mat surface a peeling layer and an electrolytic copper plating layer are electroplated in this order, and the outermost surface of the electrolytic copper plating layer is defined as a treatment side is disclosed.

These copper foils with a carrier foil are shown in FIG. 1. The ultra-thin copper foil with a carrier foil has the peeling layer 2 and the electrolytic copper plating layer (copper foil) 4 formed in this order on one side of the copper foil as a carrier 1 (called as the "carrier foil" below), and consists of the treatment side 4a formed by electrodepositing a roughening grain of a copper 5 on the exposed surface (surface) of the electrolytic copper plating layer 4.

Further, after overlapping the treatment side 4a on a glass-epoxy substrate (not illustrated), the whole is laminated, next by peeling/removing the carrier foil 1 the side of junction of the electrolytic copper plating layer and the carrier foil is exposed, the predetermined wiring pattern is formed there.

The carrier foil 1 functions as a reinforcing material (carrier) that back up the thin electrolytic copper plating layer 4 until contacting to the substrate. Further, the peeling layer 2 is a layer for peeling easily when separating the above electrolytic copper plating layer (copper foil) 4 and the carrier foil 1, hence the carrier foil 1 can be peeled clearly and easily. Note that the peeling layer 2 is removed with the carrier foil 1 together when peeling and removing the carrier foil 1.

On the contrary, on the electrolytic copper plating layer (copper foil) 4 that is attached with the glass epoxy substrate, after placing a through hole and a through hole plating are performed sequentially, an etching process is performed to a copper foil that is in the surface of the copper clad laminate, a wiring pattern 1, having a desired line width and desired pitches of adjacent lines is formed, and finally, forming of a solder resist and other finishing processes are performed.

Since a fine pattern can be formed and handling ability is superior in handling, such a copper foil with a carrier foil, in particular an ultra-thin copper foil of which thickness is very thin obtains an assessment that it is a suitable copper foil when producing a build-up wiring board in particular is obtained. However, meanwhile, the following point at issue is actualized.

The conventional electrolytic copper plating layer 4 is, as shown in FIG. 1, a portion of a salient and a portion of a depression exist on the surface (hereinafter these are defines as a salient of a based material).

When roughening grains 5 are electrodeposited on such a surface, roughening grains are electrodeposited intensively at the portion of a salient and are not electrodeposited aboundingly at the portion of a depression.

A copper foil of such a shape improves peel strength with a resin substrate, whereas is hardly dissolved and causes "treatment transfer after etching".

Conventionally, in a treatment side deposited such a roughening grain, Rz was around 3.5 mu m, it was limit that a thin line of which line/space was about 30 mu m/30 mu m to 25 mu m/25 mu m was formed, if the surface after roughening treatment was not smooth, it was impossible to form line/space was 15 mu m/15 mu m that is the to be a megatrend of a coming semiconductor package substrate.

Moreover, the surface roughness Rz is a ten point height of roughness profile described in Japanese Industrial Standards B 0601-1994.

SUMMARY OF THE INVENTION

The object of the present invention is to provide an ultra-thin copper foil that a wiring of line/space is about 15 mu m/15 mu m can be formed on a wiring board and having peel strength that is necessary to laminate with a wiring board.

An ultra-thin copper foil with a carrier foil of the first aspect of the present invention is characterized that a peeling layer, an ultra-thin copper foil are laminated in this order on a carrier foil, and the ultra-thin copper foil is an electrolytic copper foil that surface roughness of 2.5 mu m as ten point height of roughness profile, and the minimum distance between peaks of salients of a based material is 5 mu m or more.

An ultra-thin copper foil with a carrier foil of the second aspect of the present invention is characterized that a peeling layer, an ultra-thin copper foil are electroplated in this order on a carrier foil, and the ultra-thin copper foil is an electrolytic copper foil that surface roughness of 2.5 mu m as ten point height of roughness profile, the minimum distance between peaks of salients of a based material is 5 mu m or more, and a crystal grain having average grains diameter is 2 mu m or less is deposited on the surface.

In an ultra-thin copper foil with a carrier foil that a peeling layer and an ultra-thin copper foil are electroplated in this order on a carrier foil, an ultra-thin copper foil with a carrier foil of the third aspect of the present invention, has an exposed surface that chemical treatment and/or electrochemical treatment in the range without changing a profile of the exposed surface are performed.

In an ultra-thin copper foil with a carrier foil of the fourth aspect of the prevent invention, treatment of making unevenness is performed to an exposed surface of the ultra-thin copper foil by chemical etching and/or electrochemical etching, and on the uneven processed surface, chemical treatment and/or electrochemical treatment are performed in the range without changing a profile of the uneven processed surface.

In an ultra-thin copper foil with a carrier foil of the fifth aspect of the present invention, it is preferable that an exposed surface is performed roughening treatment, and it is preferable that in the roughening treatment a copper microscopic grain is formed by electrodepositing.

Further, on the treatment side, chemical treatment and/or electrochemical treatment are performed within a range that profile of the treatment side does not change.

Note that in the present invention, an ultra-thin copper foil is a copper foil having the thickness of 0.1 mu m or more and 9 mu m or less. Because the copper foil of less than 0.1 mu m has many pinholes so that it is impractical, the foil more than 9 mu m does not require to add a carrier.

It is preferable that the peeling layer is formed by Cr, Ni, Co, Fe, Mo, Ti, W, P, and/or these alloy metal layer or these hydrous oxide layer. Moreover, it is effective that the peeling layer is formed by an organic film.

The first aspect of the present invention is an ultra-thin copper foil with a carrier foil characterized that a peeling layer and an ultra-thin copper foil are electroplated in this order on a carrier foil, the ultra-thin copper foil is an electrolytic copper foil that the surface roughness is 2.5 mu m or less in ten point height of roughness profile and the minimum distance of peaks of salients of a based material is 5 mu m or more.

The second aspect of the present invention is an ultra-thin copper foil with a carrier foil characterized that a peeling layer and an ultra-thin copper foil are electroplated in this order on a carrier foil, the ultra-thin copper foil is an electrolytic copper foil that the surface roughness is 2.5 mu m or less in ten point height of roughness profile, the minimum distance of peaks of salients of a based material is 5 mu m or more, and crystal grains of which average grain diameter is 2 mu m or less are deposited on the surface.

The third aspect of the present invention is that the surface of the ultra-thin copper foil is not performed roughening treatment, and chemical and/or electrochemical treatment are performed on the surface of the ultra-thin copper foil.

The reason that Rz of the surface of the ultra-thin copper foil is necessary to be 2.5 mu m and the minimum distance between peaks of salients of a based material is necessary to be 5 mu m or more is because it is impossible that fine lines of line/space=15 mu m/15 mu m or less can be formed in the foil that a salient of a based material is high and the distance between peaks is thick, even in the case that roughening treatment is not performed on the surface.

An ultra-thin copper foil of the present invention, for example, as illustrated in FIG. 4, is a copper foil that chemical treatment and/or electrochemical treatment are performed on the surface of the copper foil of the present invention without depositing a copper roughening grain (the roughening grain 5 in FIG. 1) on the surface of the ultra-thin copper foil 4.

As mentioned above, on the surface of a conventional ultra-thin copper foil with a carrier foil, for improving peel strength with the substrate, copper roughening grains are deposited. By using copper plating solution including selenium, tellurium, arsenic, antimony, bismuth and so on usually that is different from plating solution forming the ultra-thin copper foil (for example, refer to Japanese examined patent application publication No. 1978-39327) and by treating in high current density adjacent to limit current density of copper, the above roughening grains are deposited. Therefore, the elements are taken in roughening grains deposited on the surface of the copper foil, as a result, the surface of the ultra-thin copper foil and the roughening grain layer are constituted by layers that the crystal structure and composition are different. Etching time of the grains of composition including the dopant elements is longer in comparison with etching time of the copper constituting the copper foil, therefore, when the pattern is etched by the etching solution, the roughening grain layer is hard to be etched and leads to "treatment transfer after etching".

In the copper foil of the present invention, the roughening grains that leads to "treatment transfer after etching" do not exist, because a fine wiring can be formed by forming wiring by etching.

On the contrary, a copper foil that roughening grains is not deposited has small anchoring effect and is hard to obtain large peel strength when bonding with a resin substrate. The present invention is to produce an ultra-thin copper foil with a carrier foil that a fine wiring is formed without reducing the adhesive strength with resin substrate by performing chemical treatment and/or electrochemical treatment to a degree without changing the surface profile of the copper foil before the surface treatment, and by improving chemical bonding (peel strength).

In the present invention, the chemical treatment is oxide treatment, hydrous oxide treatment, silane coupling agent treatment and so on. By these treatment, the etching speed of the processed surface is quickened up as fast as or faster than the etching speed of the copper foil in itself therefore without reducing the etching factor peel strength with the resin substrate can be improved.

The chemical treatment improving peel strength varies by kind of the resin substrate, however, for a polyimide resin, a glass epoxy resin, it is preferable to perform hydrous oxide treatment such as copper oxide treatment, chromate treatment and so on.

Silane coupling agent treatment has dissimilar peel strength by a resin, however, treatment using vinyl silane, epoxy silane, styryl silane, methacryloxy silane, acryloxy silane, amino silane, ureido silane, chloropropyl silane, mercapto silane, sulfide silane, isocyanate silane and so on is preferable.

Moreover, in the present invention, the electrochemical treatment is plating treatment such as single metal plating, alloy metal plating, and dispersion plating (plating that oxide is dispersed in metal matrix) and so on, or anodizing treatment and so on. By kind of the resin substrate plating treatment improving the peel strength is various, for a polyimide resin, nickel/nickel alloy plating, chromium/chromium alloy plating and so on are effective. Moreover, for a glass epoxy resin, zinc plating, zinc-chromium alloy plating and so on are effective. Further, copper oxide treatment formed by anodizing treatment is effective for a glass epoxy resin.

The composition of the plating may be selected so that the etching speed of the surface processed by the electrochemical treatment may be selected does not become slower than the etching speed of the copper foil in itself. If the composition that the etching speed becomes slow is selected, it is necessary to be the thickness so that the etching speed does not become slow.

For example, in the case of zinc plating, the etching speed of that is faster than copper plating. However, in the case of nickel plating or chromium plating, the etching speed is slower than the etching speed of copper plating.

In the case that nickel or chromium is selected, it is necessary to deposit the amount of the degree that the peel strength can be improved but the etching speed cannot vary. Concretely, in the case or nickel or chromium, it is effective to deposit 0.01 mg/dm 2 to 0.5 mg/dm 2. Because in the case of being below 0.01 mg/dm 2 the affect for adhesiveness is reduced, and in the case of being over 0.5 mg/dm 2 the etching speed slows.

Moreover, in similar to the case of treatment by alloy metal plating or dispersion plating, the alloy composition is selected so that the etching speed does not become slower than the etching speed of the copper foil in itself, or in the case that the composition that the etching speed becomes slow, it is necessary to be the thickness so that the etching speed does not become slow.

Note that the speed by treatment by anodization of copper is faster than the etching speed of copper.

In the present invention, the amount of deposited element onto the surface of copper foil of chemical treatment and/or electrochemical treatment to a degree without changing the surface profile is preferable to be about 0.01 mg/dm 2 to 30 mg/dm 2. It is because in the case of the deposited amount less than 0.01 mg/dm 2, it is not very effective to improve the peel strength, in the case over 30 mg/dm2, the effect to improve peel strength is saturated and the surface profile changes and abnormal electrodepositing occurs.

An ultra-thin copper foil with a carrier foil of the present invention, for example, as illustrated in FIG. 5, is characterized that treatment of making unevenness is performed by the chemical etching on the ultra-thin copper foil, and/or treatment of making unevenness is performed by the electrochemical etching on the ultra-thin copper foil, further characterized that chemical treatment and/or electrochemical treatment are performed on the surface of the ultra-thin copper foil to a degree that the profile does not change.

The treatment of making unevenness by the chemical etching is treatment of roughening the surface of the copper foil by using etching solution such as sulfuric acid-hydrogen peroxide water and so on or commercially available surface roughening solution. Therefore, since the surface of the ultra-thin copper foil in itself is roughened, peel strength with the resin substrate improves, and since the roughening grains that crystal structure or composition are different are not deposited, "treatment transfer after etching" hardly occurs in comparison with a conventional ultra-thin copper foil with a carrier foil when etching, finer pattern can be formed.

Moreover, electrochemical etching uses single sulfuric acid solution, sulfuric acid-copper sulfate solution, hydrochloric acid solution or nitric acid for electrolytic solution, and is etching treatment that electric current is passed and treatment of etching and depositing copper nodule.

For the current waveform of this case, direct current (the ultra-thin copper foil is charged +), alternate current, PR current (.+−. inverted direct current), pulse current (the ultra-thin copper foil is charged +) and so on are used.

In this case, the surface shape is different by the case of using single sulfuric acid solution or sulfuric acid-copper sulfamate solution and the case of using hydrochloric acid solution or nitric acid for electrolytic solution for electrolytic solution.

In the case of using single sulfuric acid solution or sulfuric acid-copper sulfamate solution for electrolytic solution, if treatment is performed by using alternative current or PR current (.+−. inverted direct current), etching operation (anodic dissolution) and operation of depositing copper nodule (cathodic electrodeposition) are occurred alternately to become unevenness that pit formed by etching operation on the surface and small copper nodule are deposited. Correspondingly, in the case of using hydrochloric acid solution or nitric acid for electrolytic solution, etching operation (anodic dissolution) only occurs and operation of depositing copper nodule (cathodic electrodeposition) does not occur, hence only pit formed by etching operation on the surface occurs.

In the above case, that is using sulfuric acid solution or sulfuric acid-copper sulfamate solution, excepting for using alternate current or PR current (.+−. inverted direct current), small pit is occurred on the surface of the ultra-thin copper foil and peel strength with the resin substrate is improved. Further, since also in this case the roughening grains leading to "treatment transfer after etching", when etching wiring, fine wiring can be formed.

In the case of using sulfuric acid solution or sulfuric acid-copper sulfamate solution and the case that using alternate current and PR current (.+−. inverted direct current), small copper nodule is deposited with occurring pit. However, in this case, since small copper nodule is a thing that a portion of the ultra-thin copper foil is re-deposited and composition of it is equal to the ultra-thin copper foil in itself, in comparison with a conventional roughening treatment grain, when pattern is etched, small copper nodule is easily etched and "treatment transfer after etching" is hardly occurred. Therefore, finer pattern can be formed.

In the copper foil of the present invention, since the roughening grain of which etching speed is slower than the copper foil in itself is not deposited on the surface of the copper foil, when wiring is etched, "treatment transfer after etching" is not occurred, and fine wiring of 15 mu m or less can be formed. Even after etching lines of 15 mu m or less, since chemical treatment and/or electrochemical treatment that improve peel strength with the resin are performed, the microscopic lines and the wiring substrate (resin substrate) have large peel strength.

Therefore, the printed wiring board that the high density ultra-fine wiring is preformed can be produced by the ultra-thin copper foil with a carrier foil of the present invention, moreover the multilayer printed wiring board the high density ultra-fine wiring is preformed can be produced by the ultra-thin copper foil with a carrier foil of the present invention.

The present invention is an ultra-thin copper foil with a carrier foil that a peeling layer, an ultra-thin copper foil are electroplated in this order on a carrier foil, and the ultra-thin copper foil is an electrolytic copper foil that surface roughness of 2.5 mu m as ten point height of roughness profile and the minimum distance between peaks of salients of a based material is 5 mu m or more.

Moreover, the present invention is an ultra-thin copper foil with a carrier that a peeling layer, an ultra-thin copper foil are electroplated in this order on a carrier foil, and the ultra-thin copper foil is an electrolytic copper foil that surface roughness of 2.5 mu m as ten point height of roughness profile, the minimum distance between peaks of salients of a based material is 5 mu m or more, and a crystal grain having average grains diameter is 2 mu m or less is deposited on the surface.

It is preferable that copper microscopic grains are formed by electrodepositing in the roughening treatment of the ultra-thin copper foil with a carrier foil. Further chemical treatment and/or electrochemical treatment are performed on the treatment side within a range that profile of the treatment side does not change.

The reason that Rz of the surface of the ultra-thin copper foil is necessary to be 2.5 mu m and the minimum distance between peaks of salients of a based material is necessary to be 5 mu m or more is because the roughening grains are electrodeposited evenly entirely without concentrating the roughening grains at the peak portion of a salient of the based material when the roughening grain 5 is electrodeposited.

Moreover, if the crystal grain of the average grain diameter of 2 mu m or less is deposited on the surface, it is possible to electrodeposit a microscopic grain by being affected by the crystal grain of the base (ultra-thin copper foil) when electrodepositing the roughening grain 5 on that.

A copper foil of the present invention has Rz that is controlled to be 2.5 mu m or less even after roughening grains are deposited, and has large peel strength between fine lines and a wiring substrate (resin substrate) since roughening grains are deposited aboundingly on the 15 mu m line even after 15 mu m line is etched. Therefore, a printed wiring board that high density ultra-fine wiring is performed can be produced by an ultra-thin copper foil of the present invention, and a multilayer printed wiring board that high density ultra-fine wiring is performed can be produced by an ultra-thin copper foil of the present invention.

According to the first to the fifth aspect of the present invention, a printed wiring board that high density ultra-fine wiring is performed by the ultra-thin copper foil with a carrier foil is produced.

Moreover, according to the first to the fifth aspect of the present invention, a multilayer printed wiring board that high density ultra-fine wiring is performed by the ultra-thin copper foil with a carrier foil is produced.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Preferred embodiments of the present invention will be described with reference to the accompanying drawings.

The First Embodiment

Figure 1:
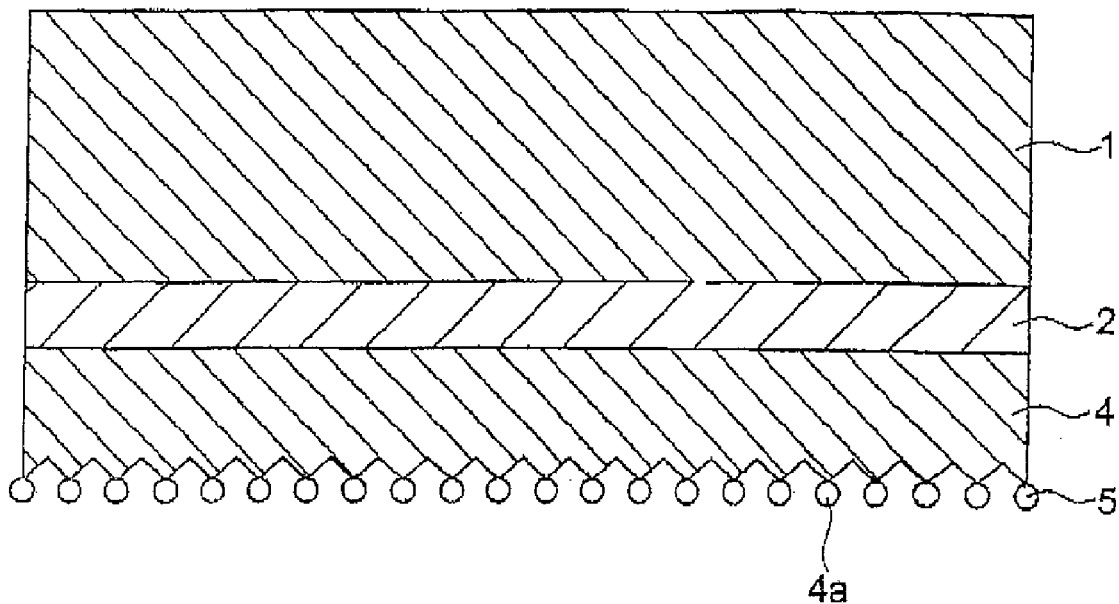
FIG. 1 is an enlarged cross sectional view of a conventional ultra-thin copper foil with a carrier foil.
Figure 2:
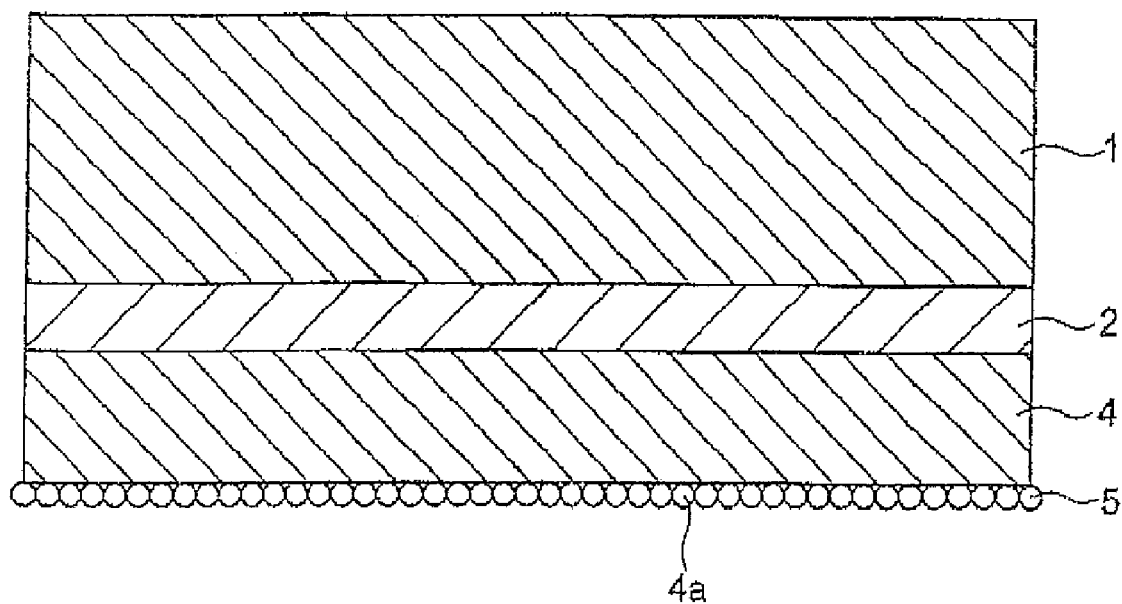
FIG. 2 in an enlarged cross sectional view of an Ultra-thin copper foil with a carrier foil of the first embodiment of the present invention.

FIG. 2 shows an ultra-thin copper foil with a carrier foil of the first embodiment of the present invention, a peeling layer 2 is formed on the surface of a carrier foil 1, and an ultra-thin copper foil 4 is formed on the peeling layer 2. The ultra-thin copper foil with a carrier foil of the first embodiment of the present invention is constituted by laminating the carrier foil 1, the peeling layer 2 and the ultra-thin copper foil 4.

The surface roughness Rz of the surface of the ultra-thin copper foil 4 is 2.5 mu m or less and the minimum distance between peaks of salients of a based material is 5 mu m or more, and a roughening grain layer 5 consisting of roughening grains 4a is formed on the surface.

To produce the surface of the ultra-thin copper foil 4 of which the surface roughness Rz is 2.5 mu m or less and the minimum distance between peaks of salients of a based material is 5 mu m or more, plating is formed by a copper plating solution that can generate a smooth surface and mirror gloss.

As the copper plating solution that can generate a smooth surface and mirror gloss, it is optimal that the copper plating solution disclose in Japanese Patent No. 3313277 or the solution containing a commercially available gloss plating dopant for decoration is used. since the ultra-thin copper foil 4 obtained from these plating solution has small surface roughness, and has a flat surface condition, further crystal grains having average grain diameter of 2 mu m are deposited, even in the case that a copper roughening grains are deposited, to form evenly microscopic grains having average grain diameter of 2 mu in as illustrated as a small points in FIG. 2.

Note that the average grain diameter of the crystal grain of the foil itself is the calculated value that first, a picture of the surface that the crystal grains are formed is taken by a transmission electron microscope (TEM), the area of the crystal grain in the picture is measured over ten point and the diameter is calculated when the crystal grain is defined as a perfect circle.

Moreover, the average grain diameter of the microscopic grains is an average value that is measured actually in SEM and is measured over ten points.

It is preferable that the peeling layer 2 set on the carrier foil 1 consists of Cr, Ni, Co, Fe, Mo, Ti, W, P and/or these alloy layer or these hydrous oxide layer, or an organic film.

It is preferable that these metals (including alloy metal) and those hydrous oxides forming the peeling layer 2 are formed by cathodic electrolytic treatment. Note that in a stage that wiring board that the ultra-thin copper foil with a carrier foil is used is formed, for stabilizing the peeling after laminating the ultra-thin copper foil with a carrier foil on the insulating substrate, nickel, iron or these alloy layer may be set together under the peeling layer 2.

As preferable binary alloys of chromium alloy for the peeling layer 2, nickel-chromium, cobalt-chromium, chromium-tungsten, chromium-copper, chromium-iron, chromium-titanium can be mentioned. As the ternary alloy, nickel-iron-chromium, nickel-chromium-molybdenum, nickel-chromium-tungsten, nickel-chromium-copper, nickel-chromium-phosphorus, cobalt-iron-chromium, cobalt-chromium-molybdenum, cobalt-chromium-tungsten, cobalt-chromium-copper, cobalt-chromium-phosphorus, etc. can be mentioned.

Moreover, in the case of using an organic film for the peeling layer 2, it is preferable that a thing consisting of one kind or two kind or more selected from among an organic compound including nitrogen, an organic compound including sulfur or a carboxylic acid is used.

The peel strength at the time of peeling the carrier foil 1 from the peeling layer 2 is influenced with the amount of deposition of these metals. That is, if an peeling layer 2 is thick (that is, if there is the large amount of deposition of plated metal), the surface of the carrier foil 1 is covered with the metal constituting the peeling material (hereinafter called as peeling layer metal) completely, it is considered that the peel strength corresponds to the peeling power which tears off the joint surfaces between the surface of the peeling layer metal and the ultra-thin copper foil 4 stacked afterward.

On the other hand, when a peeling layer 2 is thin (that is, if there is the small amount of deposition of plated metal), the surface of the carrier foil 1 is not completely covered with the peeling layer metal, it is thought that the peel strength is the peeling power which tears off the joint surfaces between the carrier foil 1 which is exposed slightly and the peeling layer metal and the ultra-thin copper foil 4 deposited on them.

Therefore, the peel strength of the carrier foil 1 and the ultra-thin copper foil 4 changes with the amount of deposition of plated metal that forms a peeling layer 2, however, since if a peeling layer 2 is formed (deposited) to some extent thickly, the peel strength will not change any more, even if the amount of deposition of the metal which forms a peeling layer 2 is made 100 mg/dm 2 or more, the peel strength does not change.

Hereinafter, examples of the ultra-thin copper foil with a carrier foil of the first embodiment of the present invention and comparative examples will be described.

Example 1

(1) Making of an Ultra-Thin Copper Foil

An untreated electrolytic copper foil having the surface (S surface) roughness of 1.2 mu m and the thickness of 35 mu m was defined as a carrier foil and on the S surface chromium electroplating was successively performed, a chromium plating layer (peeling layer) of the thickness of 0.005 mu m was formed. Next, by using a copper sulfate solution described in the following composition 1 as an electrolytic solution and performing the electrolysis in a condition that the current density was 30 A/dm 2 and the temperature of the solution was 50 degrees C., an ultra-thin copper layer (copper foil) having the thickness of 5 mu m was electroplated. 1 (Composition 1) copper sulfate (CuSO4.5H2O) 250 g/l to 350 g/l sulfuric acid (H2SO4) 80 g/l to 120 g/l3-mercapto-1-sodium propanesulfonate 0.5 ppm to 5 ppm hydroxyethyl cellulose 1 ppm to 10 ppm low-molecular-weight glue (molecular weight 3000) 1 ppm to 10 ppm Cl-10 ppm to 50 ppm On the ultra-thin copper foil in the following condition, the cathodic electrolytic treatment by direct current and copper microscopic roughening grains were electrodeposited. 2 (2-1) Forming microscopic grain core (a) Composition of the electrolytic solution copper sulfate (CuSO4.5H2O) 80 g/l to 140 g/l sulfuric acid (H2SO4) 110 g/l to 160 g/l sodium molybdate (Na2MO4.2H2O) 0.05 g/l to 3 g/l ferrous sulfate (FeSO4.7H2O) 1 g/l to 15 g/l (b) Temperature of the electrolytic solution: 35 degrees C. (c) Current density: 10 A/din 2 to 50 A/dm 2 (d) Treatment time: 2 seconds to 15 seconds (2-2) Capsule plating (a) Composition of the electrolytic solution copper sulfate (CuSO4.5H2O) 200 g/l to 300 g/l sulfuric acid (H2SO4) 90 g/l to 130 g/l (b) Temperature of the electrolytic solution; 60 degrees C. (c) Current density: 10 A/dm 2 to 30 A/dm 2 (d) Treatment time; 2 seconds to 15 seconds On the obtained ultra-thin copper foil that copper grains were deposited, nickel-phosphorus plating (Ni 0.1 mg/dm 2) and zinc plating (Zn=0.1 mg/dm 2) were performed, further additionally after chromate treatment (Cr=0.06 mg/dm 2) was performed, epoxy silane coupling agent treatment (Si=0.004 mg/dm 2) was performed.

Example 2

(1) Producing an Ultra-Thin Copper Layer

An untreated electrolytic copper foil having the surface (S surface) roughness of 1.2 mu m and the thickness of 35 mu m was defined as a carrier foil and on the S surface chromium electroplating was successively performed, a chromium plating layer (peeling layer) of the thickness of 0.005 mu m was formed. Next, by using a copper sulfate solution described in the following composition 1 as an electrolytic solution and performing the electrolysis in a condition that the current density was 10 A/dm 2 and the temperature of the solution was 35 degrees C., an ultra-thin copper layer (copper foil) having the thickness of 5 mu m was electroplated. 3 (Composition 2) copper sulfate (CuSO4.5H2O) 240 g/l sulfuric acid (H2SO4) 60 g/l cupracid 210 by Nihon Schering K.K. make up agent 0.5 cc/l brightening agent (A) 0.5 cc/l brightening agent (B) using for only complement Cl-30 ppm Note that as the complement of the brightening agent, the brightening agent (A) and the brightening agent (B) were added 300 cc respectively for amount of the current or 1000 Ah.

(2) Electrodepositing of Microscopic Roughening Grains

On the ultra-thin copper foil in the condition equal to Example 1, the cathodic electrolytic treatment by direct current and copper microscopic roughening grains were electrodeposited.

(3) Surface Treatment

On the ultra-thin copper foil that obtained copper grains were deposited, the treatment similar to Example 1 was preformed.

Example 3

An untreated electrolytic copper foil having the surface (S surface) roughness of 1.9 mu m and the thickness of 35 mu m was defined as a carrier foil and on the S surface in a way similar to Example 1, a peeling layer, an ultra-thin copper foil, a roughening grain layer were formed, and next, surface treatment was performed to produce an ultra-thin copper foil with a carrier foil.

Example 4

An untreated electrolytic copper foil having the surface (S surface) roughness of 1.8 mu m and the thickness of 35 mu m was defined as a carrier foil and on the S surface in a way similar to Example 2, a peeling layer, an ultra-thin copper foil, a roughening grain layer were formed, and next, surface treatment was performed to produce an ultra-thin copper foil with a carrier foil.

Example 5

An untreated electrolytic copper foil having the surface (S surface) roughness of 2.4 mu m and the thickness of 35 mu m was defined as a carrier foil and on the S surface in a way similar to Example 1, a peeling layer, an ultra-thin copper foil, a roughening grain layer were formed, and next, surface treatment was performed to produce an ultra-thin copper foil with a carrier foil.

Example 6

An untreated electrolytic copper foil having the surface (S surface) roughness of 2.4 mu m and the thickness of 35 mu m was defined as a carrier foil and on the S surface in a way similar to Example 2, a peeling layer, an ultra-thin copper foil, a roughening grain layer were formed, and next, surface treatment was performed to produce an ultra-thin copper foil with a carrier foil.

COMPARATIVE EXAMPLE 1

(1) Making of an Ultra-Thin Copper Foil

An untreated electrolytic copper foil having the surface (S surface) roughness of 1.2 mu m and the thickness of 35 mu m was defined as a carrier foil and on the S surface chromium electroplating was successively performed, a chromium plating layer (peeling layer) of the thickness of 0.005 mu m was formed. Next, by using a copper sulfate solution described in the following composition 3 as an electrolytic solution and performing the electrolysis in a condition that the current density was 30 A/dm 2 and the temperature of the solution was 50 degrees C., an ultra-thin copper layer (copper foil) having the thickness of 5 mu m was electroplated. 4 (Composition 3) copper sulfate (CuSO4.5H2O) 250 g/l to 350 g/l sulfuric acid (H2SO4) 80 g/l to 120 g/l low-molecular-weight glue 1 ppm to 10 ppm Cl-10 ppm to 50 ppm 2) Electrodepositing of Microscopic Roughening Grains (2-1) Forming Microscopic Grain Core In a way similar to the way indicated in Example 1, copper grains were electrodeposited.

(2-2) Capsule Plating

In a way similar to the way indicated in Example 1, capsule plating was electrodeposited.

(3) Surface Treatment

In a way similar to the way indicated in Example 1, surface treatment was performed.

COMPARATIVE EXAMPLE 2

An untreated electrolytic copper foil having the surface (S surface) roughness of 1.8 mu m and the thickness of 35 mu m was defined as a carrier foil and on the S surface in a way similar to Comparative example 1, a pealing layer, an ultra-thin copper foil, a roughening grain layer were formed, and next surface treatment was performed to produce an ultra-thin copper foil with a carrier foil.

COMPARATIVE EXAMPLE 3

An untreated electrolytic copper foil having the surface (S surface) roughness of 2.4 mu m and the thickness of 35 mu m was defined as a carrier foil and on the B surface in a way similar to Comparative example 1, a peeling layer, an ultra-thin copper foil, a roughening grain layer were formed, and next surface treatment was performed to produce an ultra-thin copper foil with a carrier foil.

COMPARATIVE EXAMPLE 4

A rolled copper foil having the surface roughness of 0.6 mu m and the thickness of 35 mu m was defined as a carrier foil and on the surface in a way similar to Comparative example 1, a peeling layer, an ultra-thin copper foil, a roughening grain layer were formed, and next surface treatment was performed to produce an ultra-thin copper foil with a carrier foil.

COMPARATIVE EXAMPLE 5

An untreated electrolytic copper foil having the thickness of 35 mu m was formed by using electrolytic solution having composition disclosed in Published Japanese translation of a PCT application No. 2003-524078 as a carrier foil. On the M surface (having the roughness of 2.0 mu m) in a way similar to Comparative example 1, a peeling layer, an ultra-thin copper foil, a roughening grain layer were formed, and next surface treatment was performed to produce an ultra-thin copper foil with a carrier foil.

Evaluation of the above Examples and the above Comparative examples was performed.

For each ultra-thin copper foil produced in Example 1 to 6, Comparative examples 1 to 5, the surface roughness (ten point height of roughness profile) Rz of the ultra-thin copper foil, the minimum distance between peaks of salients of a based material, and average grain diameter of the surface crystal grains were measured respectively, the result was indicated in Table. 1.5 TABLE 1 Surface roughness Surface of roughness Shape Average Average 5 mu m after Roughness of distance grain copper roughen—Etching of S Copper between diameter of plating Peel Tape property Carrier surface plating plating peaks crystal grain surface treatment strength peeling (L/S: foil (Rz: mu m) solution crystal (mu m) (Rz: mu m) (Rz: mu m) (Rz: mu m) (kN/cm) test mu m) Example 1 35 mu m 1.2 composition 1 granulated 8 1.5 1.1 1.9 1.21 not 10/10 MP foil crystal peeled Example 2 35 mu m 1.2 composition 2 granulated off the register 0.8 0.9 1.6 1.13 not 10/10 MP foil crystal because of peeled mirror surface Example 3 35 mu m 1.8 composition 1 granulated 8 1.5 1.2 2.0 1.31 not 15/15 MP foil crystal peeled Example 4 35 mu m 1.8 composition 2 granulated off the register 0.8 1.0 1.7 1.14 not 10/10 MP foil crystal because of peeled mirror surface Example 5 35 mu m 2.4 composition 1 granulated 8 4.5 1.3 1.9 1.37 not 15/15 MP foil crystal peeled Example 6 35 mu m 2.4 composition 2 granulated off the register 0.8 1.1 1.9 1.25 not 10/10 MP foil crystal because of peeled mirror surface Comparative 35 mu m 1.2 composition 3 columnar 4.5 2.0 2.6 3.4 1.46 peeled 30/30 example 1 MP foil crystal Comparative 35 mu m 1.8 composition 3 columnar 4.5 2.0 2.9 3.8 1.53 peeled 35/35 example 2 MP foil crystal Comparative 35 mu m 2.4 composition 3 columnar 4.5 2.0 3.0 4.0 1.58 peeled 50/50 example 3 MP foil crystal Comparative 35 mu m foil Surface composition 3 columnar 4.5 2.0 1.2 1.9 1.15 peeled 20/20 example 4 0.6 crystal Comparative 35 mu m foil M surface composition 3 columnar 4.5 2.0 2.4 3.2 1.38 peeled 30/30 example 5 1.8 crystal.

1. Measurement of Physicality

About the ultra-thin copper foil with a carrier foil of the present invention, even electrodeposition property of copper plating is superior, and as is clear from Table. 1, by performing copper plating of the thickness of 5 mu m, even if the surface roughness of former foil is as rough as 2.4 mu m, the surface roughness of the surface of the ultra-thin copper foil becomes small, the surface roughness after performing the roughening treatment is controlled small.

2. Producing of Printed Wiring Board

Next, if a printed wiring board or a multilayer printed wiring board was produced by an ultra-thin copper foil in Examples 1 to 6, etching at the ultra-fine width like line/space=10 mu m/10 mu m was possible.

3. Measurement of Peel Strength

The peel strength of the ultra-thin copper foil with a carrier foil produced in examples 1 to 6 and Comparative examples 1 to 5 was measured. The ultra-thin copper foil with a carrier foil defined as width of 10 mm was bonded on FR-4 substrate, next the carrier foil was peeled, and after plating was performed on the ultra-thin copper foil to be the thickness of 35 mu m, it was peeled to measure the peel strength. The result was indicated together in Table. 1. As shown in Table. 1, in the usual measure method (width of 10 mm), the peel strength in Comparative examples is larger than in Examples.

The peel strength in Comparative examples is larger, because since salients and depressions exist on the surface of copper foil before roughening, roughening grains are focusing to a salient portion to electrodeposit, and in a depression portion roughening grains are not electrodeposited but since the measurement is used wide width as 100 mm the anchoring effect of the roughening grains occurs to be large peel strength. However, when width becomes to be ultra-fine width such as 50 mu m or less, the peel strength is reduced so as indicating below.

4. Peel Strength

The reason that the peel strength of the ultra-thin copper foil produced in the above Comparative examples is reduced in the case width is ultra fine such that the width is 50 mu m or less is because the amount of the deposition of roughening grains in the line width becomes thinner as the line width become thinner. For confirming such a phenomenon, tape peeling test was performed by the printed wiring board produced by the ultra-thin copper foil of the present invention of which line/space=50 mu m/50 mu m and the ultra-thin copper foil of Comparative example, and the result was indicated in Table. 1.

Note that tape peeling test is evaluated whether the pattern is peeled from the resin substrate or not when peeling the above test pattern having L/S=50 mu m/50 mu m by bonding adhesive tape.

As shown in Table. 1, in the case of ultra-fine width such that line/space=50 mu m/50 mu m, the wiring of the copper foil of Comparative examples is easily peeled in comparison with the ultra-thin copper foil of the present invention.

5. Evaluation of Etching Property

The 5 mu m foil with a carrier foil of Examples 1 to 6 and Comparative examples 1 to 5 was pressed on FR-4 substrate and the carrier was peeled off.

Afterward, the test patterns having line/space=10 mu m/10 mu m, 15 mu m/15 mu m, 20 mu m/20 mu m, 25 mu m/25 mu m, 30 mu n/30 mu m, 35 mu m/35 mu m, 40 mu m/40 mu m, 45 mu m/45 mu m, 50 mu m/50 mu m (line length=30 mm, number of lines=10) were printed on the surface of the copper foil, and etching was performed in copper chloride etching solution.

The line width in the case that ten lines could be etched without bridging was indicated numerically in Table. 1. Etching was possible until 15 mu m or less in the ultra-thin copper foil produced in Examples, on the contrary, the lowest value of the ultra-thin copper foil produced in Comparative examples was 20 mu m.

As mentioned above, an ultra-thin copper foil with a carrier foil of the first embodiment of the present invention has excellent effects such that an ultra-thin copper electrolytic foil with a carrier foil that microscopic crystal grains are deposited without being affected by the surface roughness of the carrier foil can be produced, even after depositing roughening grains on the foil Rz can be controlled within 2 mu m to 3 mu m, etching can be performed until ultra-fine width such that line/space is 15 mu m or less, and, even after etching lines of 15 mu m or less, since a large number of roughening grains are deposited in the line of 15 mu m or less, despite roughness is low, fine lines and wiring board (resin substrate) have adhesive strength, and adhesive strength is large. Therefore, a printed wiring board having high density ultra-fine wiring (ultra-fine pattern) and a multilayer printed wiring board having ultra-fine pattern can be provided.

An ultra-thin copper foil of the present invention is possible to etch until ultra-fine such that line width is 15 mu m or less, and has large peel strength, hence that may not peel from a wiring substrate.

As mentioned above, a copper foil of the present invention can be applied to a circuit conductor of various kinds of wiring device, printed wiring board can be applied to various kinds of electronics device.

The Second Embodiment

Figure 3:
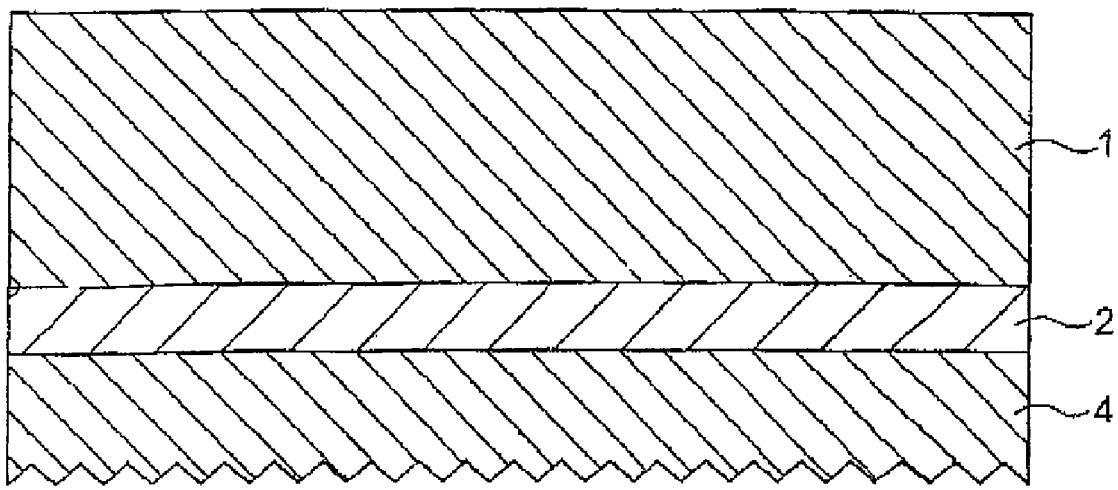
FIGS. 3 and 4 are enlarged cross sectional views of ultra-thin copper foils with a carrier foil of the second embodiment of the present invention.
Figure 4:
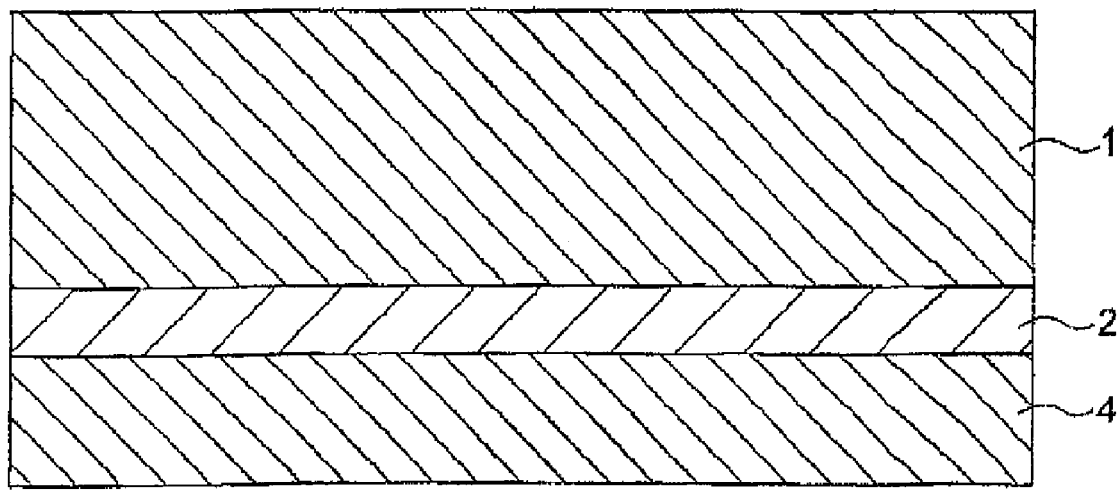

FIG. 3 and FIG. 4 are showing an ultra-thin copper foil with a carrier foil of the second embodiment of the present invention, a peeling layer 2 and an ultra-thin copper foil 4 are electroplated and formed on the surface of a carrier foil 1.

Roughening treatment is not performed on the surface of the ultra-thin copper foil 4, however, chemical treatment and/or electrochemical treatment (that is not illustrated) at a degree that the surface profile may not be changed are performed. By this treatment, chemical bond with a resin substrate and peal strength are improved.

To form a layer of the ultra-thin copper foil 4, plating is performed by the copper plating solution not including dopant or the copper plating solution including dopant.

Here the dopant means inorganic compound dopant such as arsenic compound, molybdenum compound, vanadium compound, nickel compound, cobalt compound, iron compound, tungsten compound, germanium compound and so on, or organic compound dopant such as glue, gelatin, organic active sulfur containing compound, organic dye, polymer polysaccharide, cellulose and so on.

In the case of using ouch dopant, it is possible to change a shape of the surface by the kind of dopant used.

For example, when performing plating by using sulfuric acid-copper sulfate solution containing glue S that is the above typical organic dopant and chloride ion, the shape of the surface of the ultra-thin copper foil 4 becomes a shape such that salients lie in a row (this is called as "salient of a based material").

In the case that glue and chloride ion are used as the dopants, if the thickness of the copper foil is 9 mu m, a shape that the surface roughness Rz of a salient of a based material is around 4 mu m and the minimum distance between peaks of salients of a based material is around 4 mu m to 5 mu m is formed. One embodiment of this cross section is illustrated in FIG. 3.

Here Rz indicates ton point height of roughness profile described in Japanese Industrial Standards (JIS) B 0601-1994.

By selecting a kind of dopant, it is possible to form from a shape that height of a salient of a base material is lower than 4 mu m and the minimum distance between peaks of salients is less than 5 mu m until flat shape like a mirror plane that height of a salient of a base material is lower than 4 mu m and the minimum distance between peaks of salients is 5 mu m or more. One embodiment of this cross section is illustrated in FIG. 4.

As the height of the salient of a based material becomes lower and the distance between the peaks of salients of a based material become longer, the copper foil becomes more suitable for forming fine pattern.

Moreover, Rz of the surface of ultra-thin copper foil 4 formed from copper plating solution not containing component except for copper as major component, that is to say, not containing inorganic and organic dopant, can be made about 1 mu m to 2 mu m and the minimum distance between peaks can be made 5 mu m or more by selecting current density and flow velocity of the electrolytic solution (state of stirring) at the time of producing foils. Moreover, since the surface of the ultra-thin copper foil 4 is a surface shape that a number of small salients and depressions exist, when producing a printed wiring board by using this ultra-tin copper foil with a carrier foil peel strength with a resin substrate is excellent and fine wiring can be formed. Moreover, since roughening grain does not exist and organic or inorganic impurities included in the layer of the ultra-thin copper foil 4 are very few, when wiring is etched, the fine wiring can be formed.

The Third Embodiment

Figure 5:
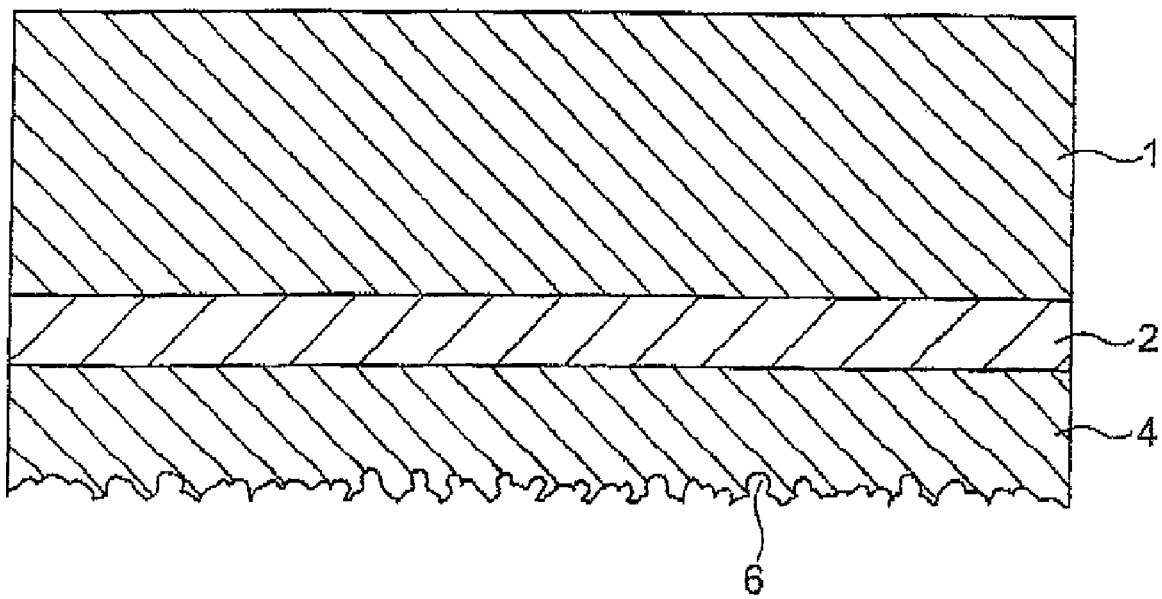
FIG. 5 is an enlarged cross sectional view of an ultra-thin copper foil with a carrier foil of the third embodiment of the present invention.

FIG. 5 is showing an ultra-thin copper foil with a carrier foil of the third embodiment, and showing a example that treatment of making unevenness is performed on the surface of an ultra-thin copper foil 4 by chemical etching, and/or treatment of making unevenness are performed by electrochemical etching.

A peeling layer 2 and the ultra-thin copper foil 4 are laminated and formed on the surface of a carrier foil 1. A small tip 6 is formed on the surface of the ultra-thin copper foil 4. Further, chemical treatment and/or electrochemical treatment (that is not illustrated) by the thickness at a degree that the surface profile on the surface of the ultra-thin copper foil 4 is not changed are performed.

It is preferable that the peeling layer 2 set on the carrier foil 1 is a layer consisting of Cr, Ni, Co, Fe, Mo, Ti, W, P and/or these alloy layer or these hydrous oxide layer, or is an organic film.

It is preferable that these metals (including alloy metal) and those hydrous oxides forming these peeling layers are formed by cathodic electrolytic treatment. Note that in a stage that wiring board that the ultra-thin copper foil with a carrier foil is used is formed, for stabilizing the peeling after laminating the ultra-thin copper foil with a carrier foil on the insulating substrate, nickel, iron or these alloy layer may be set together under these peeling layers.

Preferable binary alloy of chromium alloy for the peeling layer 2 means nickel-chromium, cobalt-chromium, chromium-tungsten, chromium-copper, chromium-iron, chromium-titanium. The ternary alloy means nickel-iron-chromium, nickel-chromium-molybdenum, nickel-chromium-tungsten, nickel-chromium-copper, nickel-chromium-phosphorus, cobalt-iron-chromium, cobalt-chromium-molybdenum, cobalt-chromium-tungsten, cobalt-chromium-copper, cobalt-chromium-phosphorus, etc.

Moreover, in the case of using an organic film for the peeling layer 2, it is preferable that a thing consisting of one kind or two kind or more selected from among an organic compound including nitrogen, an organic compound including sulfur or a carboxylic acid is used.

The peel strength at the time of peeling the carrier foil 1 from the peeling layer 2 is influenced with the amount of deposition of these metals. That is, if an peeling layer is thick (that is, if there is the large amount of deposition of plated metal), the surface of the carrier foil is covered with the metal constituting the peeling layer (hereinafter called as peeling layer metal) completely, it is considered that the peel strength corresponds to the peeling power which tears off the joint surfaces between the surface of the peeling layer metal and the ultra-thin copper foil stacked afterward.

On the other hand, when a peeling layer 2 is thin (that is, if there is the small amount of deposition of plated metal), the surface of the carrier foil is not completely covered with the peeling layer metal, it is thought that the peel strength is the peeling power which tears off the joint surfaces between the carrier foil which is exposed slightly and the peeling layer metal and the ultra-thin copper foil deposited on them. Therefore, although the peel strength of the carrier foil and the ultra-thin copper foil changes with the amount of deposition of plated metal that forms a peeling layer, if a peeling layer is formed (deposited) to some extent thickly, the peel strength will not change any more. According to the experiment, as the amount of deposition of the metal, which forms a peeling layer, even if the amount of deposition of is made 100 mg/dm 2 or more, the peel strength does not change.

Example 7

(1) Making of an Ultra-Thin Copper Foil

An untreated electrolytic copper foil having the surface (S surface) roughness of 1.8 mu m and the thickness of 35 mu m was defined as a carrier foil and on the S surface chromium electroplating was successively performed, a chromium plating layer reeling layer) of the thickness of 0.005 mu m was formed. Next, after performing strike plating by copper pyrophosphate plating solution, a copper sulfate solution described in the following composition 4 was used as an electrolytic solution and the electrolysis was performed in a condition that the current density was 10 A/dm 2 to 30 A/dm 2 and the temperature of the solution was 40 degrees C. to 60 degrees C., an ultra-thin copper layer (copper foil) having the thickness of 5 mu m was electroplated.

Condition of copper pyrophosphate strike plating 6 Cu 2P2 O 7.3H2O 5 g/l to 50 g/l K 4P 2O 7 50 g/l to 300 g/l pH 8 to 10 current density 1 A/dm 2 to 3 A/dm 2 treatment time 30 seconds (Composition 4) copper sulfate (CUSO 4.5H2O) 250 g/l to 350 µl sulfuric acid (H 2SO 4) 80 g/l to 120 g/l (2) Surface Treatment On the obtained ultra-thin copper foil, nickel-phosphorus plating (Ni=0.1 mg/dm 2) and zinc plating (Zn=0.1 mg/dm 2) were performed, further additionally after chromate treatment (Cr=0.06 mg/dm 2) was performed, epoxy silane coupling agent treatment (Si=0.0004 mg/dm 2) was performed.

Example 8

(1) Making of an Ultra-Thin Copper Foil

An untreated electrolytic copper foil having the surface (S surface) roughness of 1.8 mu m and the thickness of 35 mu m was defined as a carrier foil and on the S surface chromium electroplating was successively performed, a chromium plating layer (peeling layer) of the thickness of 0.005 mu m was formed. Next, after performing strike plating by copper pyrophosphate plating solution equal to Example 7, a copper sulfate solution described in the following composition 5 was used as an electrolytic solution and the electrolysis was performed in a condition that the current density was 10 A/dm 2 to 30 A/dm 2 and the temperature of the solution was 50 degrees C., an ultra-thin copper layer (copper foil) having the thickness of 5 mu m was electroplated. 7 (Composition 5) copper sulfate (CuSO 4.5H 2O) 250 g/l to 350 µl sulfuric acid (H 2SO 4) 80 g/l to 120 µl glue 1 ppm to 10 ppm Cl-10 ppm to 50 ppm On the obtained ultra-thin copper foil, the surface treatment similar to Example 7 was performed.

Example 9

(1) Making of an Ultra-Thin Copper Foil

An untreated electrolytic copper foil having the surface (S surface) roughness of 1.8 mu m and the thickness of 35 mu m was defined as a carrier foil and on the S surface chromium electroplating was successively performed, a chromium plating layer peeling layer) of the thickness of 0.005 mu m was formed. Next, after performing strike plating by copper pyrophosphate plating solution equal to Example 7, a copper sulfate solution described in the following composition 6 was used as an electrolytic solution and the electrolysis was performed in a condition that the current density was 10 A/dm 2 to 30 A/dm 2 and the temperature of the solution was 50 degrees C., an ultra-thin copper layer (copper foil) having the thickness of 5 mu m was electroplated. 8 (Composition 6) copper sulfate (CuSO 4.5H 2O) 250 g/l to 350 g/l sulfuric acid (H 2SO 4) 80 g/l to 120 g/l 3-mercapto-1-sodium propane-sulfonate 0.5 ppm to 5 ppm hydroxyethyl cellulose 1 ppm to 10 ppm low-molecular-weight glue (molecular weight 3000) 1 ppm to 10 ppm Cl-10 ppm to 50 ppm (2) Surface Treatment On the obtained ultra-thin copper foil, the surface treatment similar to Example 7 was performed.

Example 10

(1) Making of an Ultra-Thin Copper Foil

As similar to Example 7, An untreated electrolytic copper foil having the surface (S surface) roughness of 1.9 mu m and the thickness of 35 mu m was defined as a carrier foil, after performing electroplating of chromium on the S surface and strike-plating by copper pyrophosphate plating solution, ultra-thin copper layer (copper foil) having the thickness of 6 mu m was electroplated.

(2) Forming of Surface Unevenness

The surface was etched by 1 mu m by etchBOND of MEC CO., LTD. The etching condition is indicated below. 9 treatment chemical cz-8100 spray pressure 2.0 kg/cm 2 treatment temperature 35 degrees C.

On the obtained ultra-thin copper foil, the surface treatment similar to Example 7 was performed.

Example 11

(1) Making of an Ultra-Thin Copper Foil

As similar to Example 7, An untreated electrolytic copper foil having the surface (S surface) roughness of 1.8 mu m and the thickness of 35 mu m was defined as a carrier foil, after performing electroplating of chromium on the S surface and strike-plating by copper pyrophosphate plating solution, ultra-thin copper layer (copper foil) having the thickness of 7 mu m was electroplated.

(2) Forming of Surface Unevenness

Treatment of making unevenness was performed on the surface of the ultra-thin copper layer by the following condition. Theoretical dissolution quantity is 2 mu m.

Here, the theoretical amount of dissolution means the dissolution quantity calculated from the applied electric quantity in the case of dissolving in a state that electric efficiency is 100 percent. 10 (a) composition of electrolytic solution: hydrochloric acid (HCL) 80 g/l to 100 g/l (b) temperature of electrolytic solution: 40 degrees C. (c) current density: 25 A/dm 2 to 40 A/din 2 (d) treatment time: 12.5 seconds to 25 seconds

COMPARATIVE EXAMPLE 6

(1) Making of an Ultra-Thin Copper Foil

As similar to Example 7, An untreated electrolytic copper foil having the surface (8 surface) roughness of 1.8 mu m and the thickness of 35 mu m was defined as a carrier foil, after performing electroplating of chromium on the S surface and strike-plating by copper pyrophosphate plating solution, ultra-thin copper layer (copper foil) having the thickness of 5 mu m was electroplated.

(2) Electrodepositing of Microscopic Roughening Grains

Cathodic electrolytic treatment was performed by direct current and microscopic roughening copper grains are electrodeposited on the ultra-thin copper foil in the following condition. 11 (i) Forming core of microscopic grains (a) composition of electrolytic solution: copper sulfate (CuSO 4.5H 2O) 90 g/l to 130 g/l sulfuric acid (H 2SO 4) 110 g/l to 140 g/l arsenious acid (As 2O 3) 100 ppm to 200 ppm (as As) (b) temperature of electrolytic solution: 30 degrees C. (c) current density: 10 A/dm 2 to 50 A/dm 2 (d) treatment time: 2 seconds to 15 seconds (ii) Capsule plating (a) composition of electrolytic solution: copper sulfate (CuSO 4.5H 2O) 200 g/l to 300 µl sulfuric acid (H 2SO 4) 90 g/l to 130 g/l (b) temperature of electrolytic solution: 50 degrees C. (c) current density: 10 A/dm 2 to 30 A/dm 2 (d) treatment time: 2 seconds to 15 seconds On the obtained ultra-thin copper foil, zinc plating (Zn=0.1 mg/dm 2) was performed, further additionally after chromate treatment (Cr=0.06 mg/dm 2) was performed, epoxy silane coupling agent treatment (Si=0.0004 mg/dm 2) was performed.

COMPARATIVE EXAMPLE 7

(1) Making of an Ultra-Thin Copper Foil

As similar to Example 8, An untreated electrolytic copper foil having the surface (S surface) roughness of 1.0 mu m and the thickness of 35 mu m was defined as a carrier foil, after performing electroplating of chromium on the S surface and strike-plating by copper pyrophosphate plating solution, ultra-thin copper layer (copper foil) having the thickness of 5 mu m was electroplated.

(2) Electrodepositing of Microscopic Roughening Grains

Cathodic electrolytic treatment was performed by direct current and microscopic roughening copper grains are electrodeposited on the ultra-thin copper foil in the condition equal to Comparative example 6.

(3) Surface Treatment

On the obtained ultra-thin copper foil, the surface treatment similar to Comparative example 6 was performed.

COMPARATIVE EXAMPLE 8

(1) Making of an Ultra-Thin Copper Foil

As similar to Example 9, An untreated electrolytic copper foil having the surface (S surface) roughness of 1.8 mu m and the thickness of 35 mu m was defined as a carrier foil, after performing electroplating of chromium on the S surface and strike-plating by copper pyrophosphate plating solution, ultra-thin copper layer (copper foil) having the thickness of 5 mu m was electroplated.

(2) Electrodepositing of Microscopic Roughening Grains

Cathodic electrolytic treatment was performed by direct current and microscopic roughening copper grains are electrodeposited on the ultra-thin copper foil in the condition equal to Comparative example 6.

(3) Surface Treatment

On the obtained ultra-thin copper foil, the surface treatment similar to Comparative example 6 was performed.

Evaluation

For each ultra-thin copper foil produced in Example 7 to 12, Comparative examples 6 to 8, the surface roughness (ten point height of roughness profile) Rz of the ultra-thin copper foil was measured, and the result was indicated in Table. 2.12 TABLE 2 Surface Surface roughness of roughness Roughness ultra-thin after of S Copper copper foil roughening Peel Etching Carrier surface plating right after treatment strength property foil (Rz: mu m) solution plating (Rz: mu m) (kN/cm) (L/S: mu m) Example 7 35 mu m 1.8 composition 1 1.9 1.9 1.00 10/10 MP foil Example 8 35 mu m 1.8 composition 2 2.1 2.1 1.05 10/10 MP foil Example 9 35 mu m 1.8 composition 3 1.7 1.7 0.80 10/10 MP foil Example 10 35 mu m 1.8 composition 1 1.9 2.5 1.10 10/10 MP foil Example 11 35 mu m 1.8 composition 1 1.9 1.9 1.15 10/10 MP foil Example 12 35 mu m 1.8 composition 1 1.9 1.9 1.20 10/10 MP foil Comparative 35 mu m 1.8 composition 1 1.9 3.2 1.20 30/30 example 6 MP foil Comparative 35 mu m 1.8 composition 2 1.7 3.7 1.25 35/35 example 7 MP foil Comparative 35 mu m 1.8 composition 3 2.1 2.8 1.10 30/30 example 8 MP foil 1. Measurement of Properties Since roughening treatment grains are not deposited, as is clear from Table. 2, in an ultra-thin copper foil with a carrier foil of the present invention, the surface roughness is controlled small.

2. Measurement of Peel Strength

The peel strength of the ultra-thin copper foil with a carrier foil produced in examples 7 to 12 and Comparative examples 6 to 8 was measured. After the ultra-thin copper foil with a carrier foil was cut to 250 mm by 250 mm, a polyimide sheet (UPILEX-VT made by Ube Industry) was placed on the surface of the ultra-thin copper foil, the assembly was sandwiched with two flat stainless steel plates, then the assembly was laminated at the temperature of 330 degrees C. and the pressure of 2 kg/cm 2 for 10 minutes by 20 torr vacuum press, then was laminated at the temperature of 330 degrees C. and the pressure of 50 kg/cm 2 for 5 minutes to produce a one-sided copper-clad polyimide laminated board for the test of peel strength with a carrier foil. After peeling the carrier foil, performing plating on the ultra-thin copper foil and making the thickness to be 35 mu m, the peel strength was measured by 10 mm width. The result is indicated together in Table. 2.

As shown in Table. 2, Examples have sufficient peel strength.

3. Evaluation of Etching Property

After laminating the ultra-thin copper foil with a carrier foil of Examples 7 to 12 and Comparative examples 6 to 8 on the polyimide sheet, the carrier foil was peeled.

After that, the test patterns having line/space=10 mu m/10 mu m, 15 mu m/15 mu m, 20 mu m/20 mu m, 25 mu m/25 mu m, 30 mu m/30 mu m, 35 mu m/35 mu m, 40 mu m/40 mu m, 45 mu m/45 mu m, 50 mu m/50 mu m (line length=30 mm, number of lines=10) were printed on the surface of the copper foil, and etching was performed in copper chloride etching solution.

The line width in the case that ten lines could be etched without bridging was indicated numerically in Table. 2. Etching was possible until 10 mu m or less in the ultra-thin copper foil produced in Examples, on the contrary, the minimum of the ultra-thin copper foil produced in Comparative examples was 30 mu m.

As mentioned above, chemical treatment and/or electrochemical treatment for improving peel strength with a resin substrate was performed without depositing roughening grains that etching speed is low on the ultra-thin copper foil with a carrier foil by the second and third embodiments of the present invention, or after performing treatment of making unevenness by chemical etching and/or electrochemical etching without depositing roughening grains that etching speed is low on the ultra-thin copper foil, further chemical treatment and/or electrochemical treatment for improving peel strength with a resin substrate was performed. As the result, since in these copper foils, it is possible to etch until ultra-fine width that line/space is 15 mu m or less, and peel strength with a resin substrate is large despite that roughness is low, it is possible to produce printed wiring board with an ultra-fine pattern and multilayer printed wiring board with ultra-fine pattern by the ultra-thin copper foil of the present invention.

What is claimed is:

1. An ultra-thin copper foil with a carrier foil for a printed circuit board, comprising:
   a carrier foil, a peeling layer, and the ultra-thin copper foil are electroplated in this order, and
   a wiring of line/space of about 15 μm/15 μm formed on an exposed surface of the ultra-thin copper foil,
   wherein said ultra-thin copper foil is an electrolytic copper foil that has a surface roughness of 2.5 μm or less as ten point height of roughness profile, a minimum distance between peaks of salients of a based material is 5 μm or more, and a thickness is 0.1 μm or more and 9 μm or less.

2. An ultra-thin copper foil with a carrier foil as set forth in claim 1, wherein the roughness profile of said ultra-thin copper foil does not change when chemically treated and/or electromechanically treated within a predetermined range.

3. An ultra-thin copper foil with a carrier foil as set forth in claim 1, wherein the exposed surface of the ultra-thin copper foil includes a copper microscopic grain.

4. An ultra-thin copper foil with a carrier foil as set forth in claim 1, wherein said peeling layer consists of Cr, Ni, Co, Fe, Mo, Ti, W, P and/or an alloy metal layer of combination of Cr, Ni, Co, Fe, Mo, Ti, W, P, or a hydrous oxide layer of combination of Cr, Ni, Co, Fe, Mo, Ti, W, P, or an organic film.

5. A printed wiring board as set forth in claim 1.

6. An ultra-thin copper foil with a carrier foil, comprising:
   a carrier foil, a peeling layer, and the ultra-thin copper foil are electroplated in this order, and
   a wiring of line/space of about 15 μm/15 μm formed on an exposed surface of the ultra-thin copper foil,
   wherein said ultra-thin copper foil is an electrolytic copper foil that has a surface roughness of 2.5 μm or less as ten point height of roughness profile, a minimum distance between peaks of salients of a based material is 5 μm or more, a thickness is 0.1 μm or more and 9 μm or less, and a crystal grain having average grain diameters of 2 μm or less is deposited a surface of the copper foil.

7. An ultra-thin copper foil with a carrier foil as set forth in claim 6, wherein the roughness profile of said ultra-thin copper foil is does not change when chemically treated and/or electromechanically treated within a predetermined range.

8. An ultra-thin copper foil with a carrier foil as set forth in claim 6, wherein the exposed surface of the ultra-thin copper foil includes a copper microscopic grain.

9. An ultra-thin copper foil with a carrier foil as set forth in claim 6, wherein said peeling layer consists of Cr, Ni, Co, Fe, Mo, Ti, W, P and/or an alloy metal layer of combination of Cr, Ni, Co, Fe, Mo, Ti, W, P, or a hydrous oxide layer of combination of Cr, Ni, Co, Fe, Mo, Ti, W, P, or an organic film.

10. A printed wiring board as set forth in claim 6.

11. A manufacturing method of an ultra-thin copper foil with a carrier foil for a printed circuit board comprising:
    a step of providing a carrier foil, a peeling layer and the ultra-thin copper foil for forming an electrolytic copper foil having surface roughness of 2.5 μm or less as ten point height of roughness profile, having a minimum distance between peaks of salients of a based material is 5 µm or more, having a thickness that is 0.1 µm or more and 9 µm or less, and having a crystal grain having average grain diameters of 2 µm or less deposited on an exposed surface in this order, a step of performing a chemical treatment and/or an electrochemical treatment onto an exposed surface of said ultra-thin copper foil within a range so that the profile of said exposed surface does not change, and a step of printing wiring of line/space of about 15 µm/15 µm on said exposed surface of said ultra-thin copper foil.

12. A manufacturing method of an ultra-thin copper foil with a carrier foil for a printed circuit board, comprising:

a step of providing a carrier foil, a peeling layer and the ultra-thin copper foil for forming an electrolytic copper foil having surface roughness of 2.5 µm or less as ten point height of roughness profile, having a minimum distance between peaks of salients of a based material is 5 µm or more, having a thickness that is 0.1 µm or more and 9 µm or less, and having a crystal grain having average grain diameters of 2 µm or less deposited on an exposed surface in this order, performing a roughening treatment on a surface of the ultra-thin copper foil; and performing a chemical treatment and/or an electrochemical treatment onto the treatment surface of said ultra-thin copper foil within a range so that the profile of said treatment side does not change, and printing a wiring of line/space of about 15 µm/15 µm on said exposed surface said ultra-thin copper foil.

13. A manufacturing method of an ultra-thin copper foil with a carrier foil as set forth in claim 12, wherein the roughening treatment of the surface of said ultra-thin copper foil is a roughening plating by which a copper microscopic grain is electrodeposited.

14. A manufacturing method of an ultra-thin copper foil with a carrier foil as set forth in claim 12, wherein the roughening treatment of the surface of said ultra-thin copper foil is performed by chemical etching and/or electrochemical etching.

15. A manufacturing method of an ultra-thin copper foil with a carrier foil as set forth in claim 12, wherein said peeling layer consists of Cr, Ni, Co, Fe, Mo, Ti, W, P and/or an alloy metal layer of combination of Cr, Ni, Co, Fe, Mo, Ti, W, P, or a hydrous oxide layer of combination of Cr, Ni, Co, Fe, Mo, Ti, W, P, or an organic film.

* * * * *